United States Patent
Kaji et al.

(10) Patent No.: US 12,469,802 B2
(45) Date of Patent: Nov. 11, 2025

(54) SEMICONDUCTOR DEVICE AND POWER CONVERTER

(71) Applicant: Mitsubishi Electric Corporation, Tokyo (JP)

(72) Inventors: Yusuke Kaji, Tokyo (JP); Aya Fujita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 325 days.

(21) Appl. No.: 17/614,552

(22) PCT Filed: Jun. 19, 2019

(86) PCT No.: PCT/JP2019/024289
§ 371 (c)(1),
(2) Date: Nov. 28, 2021

(87) PCT Pub. No.: WO2020/255297
PCT Pub. Date: Dec. 24, 2020

(65) Prior Publication Data
US 2022/0223546 A1 Jul. 14, 2022

(51) Int. Cl.
*H01L 23/00* (2006.01)
*H01L 23/049* (2006.01)
(Continued)

(52) U.S. Cl.
CPC .......... *H01L 23/564* (2013.01); *H01L 23/049* (2013.01); *H01L 23/3107* (2013.01);
(Continued)

(58) Field of Classification Search
CPC . H01L 23/564; H01L 23/049; H01L 23/3107; H01L 23/36; H01L 23/04;
(Continued)

(56) References Cited

U.S. PATENT DOCUMENTS 5,446,318 A * 8/1995 Koike ................ H01L 24/49
257/E23.106
5,621,243 A * 4/1997 Baba ................ H01L 23/3736
257/713

(Continued)

FOREIGN PATENT DOCUMENTS

CN 108538793 A 9/2018
CN 112236860 A * 1/2021 .......... H01L 23/049
(Continued)

OTHER PUBLICATIONS

International Search Report and Written Opinion mailed on Aug. 27, 2019, received for PCT Application PCT/JP2019/024289, Filed on Jun. 19, 2019, 9 pages including English Translation.
(Continued)

*Primary Examiner* — Teresa M. Arroyo
(74) *Attorney, Agent, or Firm* — XSENSUS LLP (57) ABSTRACT

The present invention provides a semiconductor device and a power converter having improved moisture resistance reliability. The semiconductor device of the present invention includes: a metal base substrate which includes a first insulating layer provided on a metal base, a support conductor provided on the first insulating layer, and a second insulating layer provided on a side surface of the support conductor; a semiconductor element bonded to the support conductor; a case provided outside the second insulating layer; an external terminal attached to the case; and a sealing member filled in a region surrounded by the support conductor, the second insulating layer and the case.

20 Claims, 5 Drawing Sheets

(51) Int. Cl.
*H01L 23/31* (2006.01)
*H01L 25/07* (2006.01)
*H02P 27/08* (2006.01)

(52) U.S. Cl.
CPC .............. *H01L 24/32* (2013.01); *H01L 24/48* (2013.01); *H01L 24/73* (2013.01); *H01L 25/072* (2013.01); *H01L 2224/32245* (2013.01); *H01L 2224/48175* (2013.01); *H01L 2224/48245* (2013.01); *H01L 2224/73265* (2013.01); *H02P 27/08* (2013.01)

(58) Field of Classification Search
CPC ... H01L 23/24; H01L 23/3135; H01L 23/053; H01L 2224/32245; H01L 2224/48175; H01L 2224/48245; H01L 2224/73265; H01L 2224/32225; H01L 2224/45124; H01L 2224/45147; H01L 2224/48091; H01L 2224/48227; H01L 2224/48472; H01L 2224/49111; H01L 2224/49175; H01L 2224/83801; H01L 2224/29101; H01L 24/83; H01L 24/29; H01L 24/49; H01L 24/32; H01L 24/48; H01L 24/73; H01L 24/45; H01L 25/18; H01L 25/072; H01L 2924/181; H01L 2924/19107; H01L 2924/00014; H01L 2924/14; H01L 2924/00012; H02P 27/08
USPC ......................................................... 257/691
See application file for complete search history.

(56) References Cited

U.S. PATENT DOCUMENTS

| | | | | |
|---|---|---|---|---|
| 5,767,579 | A * | 6/1998 | Kanazawa | H01L 25/16 257/691 |
| 5,920,119 | A * | 7/1999 | Tamba | H01L 25/072 257/726 |
| 6,914,321 | B2 * | 7/2005 | Shinohara | H01L 24/49 257/691 |
| 2011/0075451 | A1 * | 3/2011 | Bayerer | H01L 24/85 257/692 |
| 2013/0134572 | A1 * | 5/2013 | Lenniger | H01L 23/367 438/122 |
| 2013/0240909 | A1 * | 9/2013 | Hiramatsu | H01L 29/1608 257/77 |
| 2015/0270201 | A1 * | 9/2015 | Kim | H01L 23/49562 257/676 |
| 2018/0254228 | A1 | 9/2018 | Kuga | |
| 2019/0115228 | A1 * | 4/2019 | Yuasa | H01L 23/3735 |
| 2020/0373251 | A1 * | 11/2020 | Hirotsuru | H01L 25/07 |
| 2021/0134762 | A1 | 5/2021 | Hayashi et al. | |

FOREIGN PATENT DOCUMENTS

| | | | | |
|---|---|---|---|---|
| DE | 11 2012 006 656 T5 | 3/2015 | | |
| DE | 11 2017 004 739 T5 | 7/2019 | | |
| JP | 2005-210006 A | 8/2005 | | |
| JP | 2007012726 A | 1/2007 | | |
| JP | 2008-218907 A | 9/2008 | | |
| JP | 2009-224445 A | 10/2009 | | |
| JP | 2016115900 A * | 6/2016 | ............. | H01L 23/04 |
| WO | WO-2014109208 A1 * | 7/2014 | ............. | H01L 23/08 |
| WO | 2018194090 A1 | 10/2018 | | |
| WO | 2018/211751 A1 | 11/2018 | | |
| WO | WO-2019038906 A1 * | 2/2019 | ............. | H01L 23/24 |

OTHER PUBLICATIONS

Office Action issued Apr. 30, 2024 in German Patent Application No. 11 2019 007 476.8, 13 pages.

First Office Action issued Oct. 21, 2024 in corresponding Chinese Patent Application No. 201980097488.5 (18 pages; with English translation).

Office Action of Mar. 12, 2025 issued in counterpart Chinese patent application No. CN201980097488.5 (16 pages; with English machine translation).

Office Action dated May 19, 2025 in corresponding Chinese patent application No. 201980097488.5 (21 pages; with English translation).

* cited by examiner

SEMICONDUCTOR DEVICE AND POWER CONVERTER

CROSS-REFERENCE TO RELATED APPLICATION

The present application is based on PCT filing PCT/JP2019/024289, filed Jun. 19, 2019, the entire contents of which are incorporated herein by reference.

TECHNICAL FIELD

The present invention relates to a semiconductor device including a case and a power converter to which the semiconductor device is applied.

BACKGROUND ART

A conventional semiconductor device includes a metal base substrate and a case provided on the metal base substrate, wherein the metal base substrate includes a metal plate, a heat transfer layer which is provided on the metal plate and includes a thermosetting resin and an inorganic filler, and a lead frame which is embedded in the heat transfer layer to form a plurality of electrodes, and the case is fixed to the metal base substrate (for example, see PTL 1). In the conventional semiconductor device, the heat transfer layer includes a portion which is provided in contact with a side surface of the lead frame and contributes to electrical insulation between the electrodes, and a portion which is provided between the lead frame and the metal plate and contributes to heat radiation and electrical insulation.

CITATION LIST

Patent Literature

PTL 1: Japanese Patent Laying-Open No. 2009-224445

SUMMARY OF INVENTION

Technical Problem

However, in the conventional semiconductor device described above, since the case is provided on the heat transfer layer of the metal base substrate, a portion of the heat transfer layer, which is provided in contact with the side surface of the lead frame and electrically insulates the electrodes, is exposed to the outside air. Since the heat transfer layer includes a thermosetting resin and an inorganic filler, there is a problem that moisture may infiltrate from the portion exposed to the outside air, as a result, the metal components at the terminal portion of the semiconductor device will be corroded by the moisture and the electric field, which leads to a breakdown of the semiconductor device, reducing the reliability of the semiconductor device.

The present invention has been made in order to solve the above-mentioned problems, and an object of the present invention is to provide a semiconductor device which is provided with a case on a metal base substrate so as to prevent moisture from reaching a semiconductor element, whereby improves moisture resistance reliability.

Solution to Problem

The semiconductor device according to the present invention includes: a metal base substrate which includes a metal base, a first insulating layer provided on a surface of the metal base, a support conductor provided on a surface of the first insulating layer opposite to the surface on which the metal base is provided, and a second insulating layer provided on a side surface of the support conductor so as to expose a surface of the support conductor opposite to the surface in contact with the first insulating layer; a semiconductor element bonded to the support conductor; a case provided outside the second insulating layer, an external terminal attached to the case; and a sealing member filled in a region surrounded by the support conductor, the second insulating layer and the case.

Advantageous Effects of Invention

In the semiconductor device according to the present invention, since the case is provided outside the second insulating layer, even if the case is provided on the metal base substrate, it is possible to prevent moisture from infiltrating through the second insulating layer to the semiconductor element, whereby improves the moisture resistance reliability.

DESCRIPTION OF EMBODIMENTS

Hereinafter, embodiments of the present invention will be described with reference to the drawings. In the following drawings, the same or corresponding portions are denoted by the same reference numerals, and the description thereof will not be repeated.

First Embodiment

Figure 1:
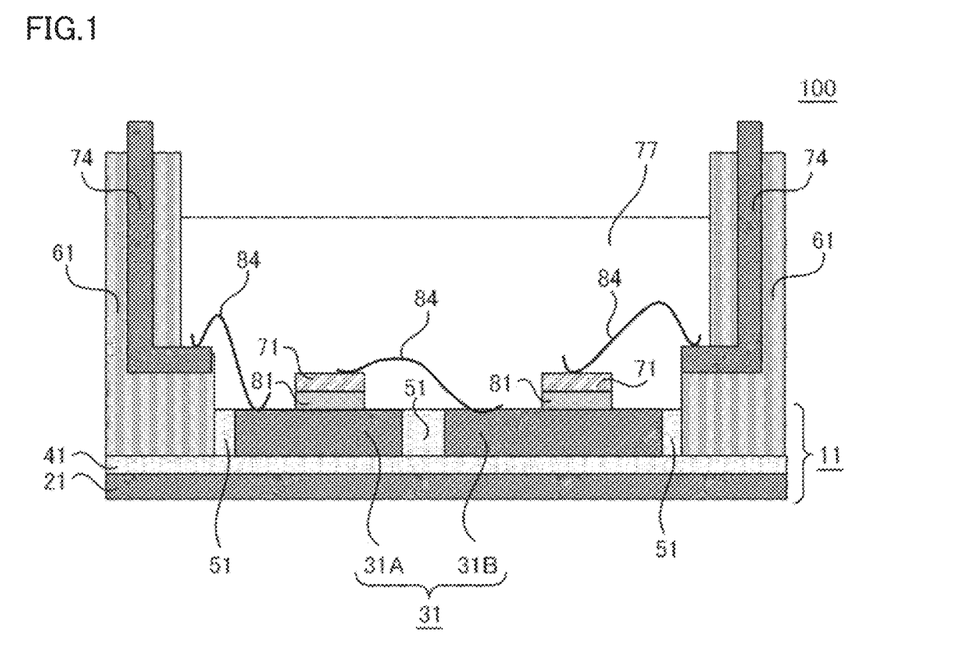
FIG. 1 is a cross-sectional view illustrating the configuration of a semiconductor device according to a first embodiment of the present invention.
Figure 2:
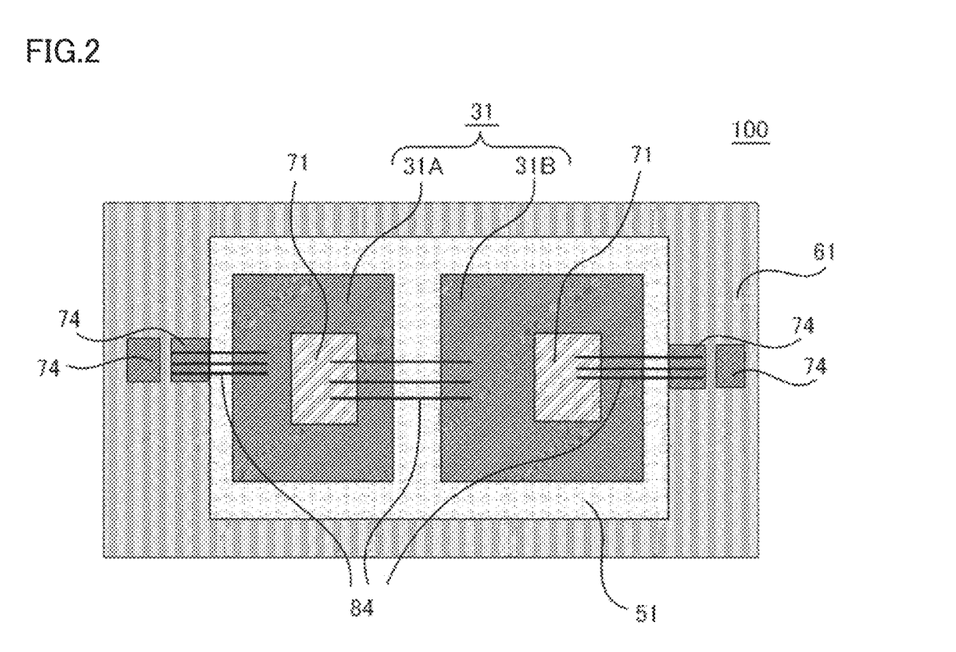
FIG. 2 is a top view illustrating the configuration of the semiconductor device according to the first embodiment of the present invention.

A semiconductor device according to a first embodiment of the present invention will be described with reference to FIG. 1. FIG. 1 is a cross-sectional view illustrating the configuration of a semiconductor device 100 of the present embodiment. FIG. 2 is a top view illustrating the semiconductor device 100 when the semiconductor device 100 is viewed from the top. A first insulating layer 41 is provided on a surface of the metal base 21. A support conductor 31 is provided on a surface of the first insulating layer 41 opposite to the surface on which the metal base 21 is provided. In the present embodiment, the support conductor 31 includes a first support conductor 31A and a second support conductor 31B. Although FIG. 1 illustrates that the support conductor 31 includes two support conductors of the first support conductor 31A and the second support conductor 31B, the support conductor 31 may include three or more support conductors. A second insulating layer 51 is provided on a side surface of the support conductor 31 so as to expose a surface of the support conductor 31 opposite to the surface in contact with the first insulating layer 41. A metal base substrate 1I includes the metal base 21, the first insulating layer 41, the support conductor 31, and the second insulating layer 51. A semiconductor element 71 is mounted on the support conductor 31 and bonded to the support conductor 31 via a conductive bonding member such as a solder 81. In the present embodiment, as an example, the semiconductor element 71 is made of a semiconductor material such as silicon (Si). As the conductive bonding member, a sintered metal bonding member obtained by sintering silver particles, copper particles or the like may also be used. The case 61 is provided on the first insulating layer 41 as illustrated in a cross-sectional view of FIG. 1 and outside the second insulating layer 51 so as to surround the entire side surface of the second insulating layer 51 as illustrated in a plan view of FIG. 2. In other words, the case 61 is provided on the metal base substrate 11. External terminals 74, except for two ends thereof, are embedded in the case 61. In order to prevent the moisture in the outside air from infiltrating into the semiconductor element 71 mounted on the support conductor 31, a sealing member 77 is filled in a region surrounded by the case 61 and a bottom surface formed by the first support conductor 31A, the second support conductor 31B and the second insulating layer 51. The semiconductor device 100 further includes a wiring member such as a wire 84.

The metal base 21 and the support conductor 31 are not particularly limited, and they may be made of a metal material such as copper (Cu) or aluminum (Al), or may be made of an alloy such as an aluminum-silicon carbide alloy (AlSiC) or a copper-molybdenum alloy (CuMo). The metal base 21 and the support conductor 31 may be made of the same material or may be made of different materials. The metal base 21 may be provided with a heat radiation fin made of a metal material such as copper (Cu) or aluminum (Al), or may be provided with a heat sink.

In the semiconductor device 100, the first insulating layer 41 and the second insulating layer 51 are separate members made of different materials. The first insulating layer 41 is provided for the purpose of ensuring electrical insulation between the first support conductor 31A and the metal base 21, electrical insulation between the second support conductor 31B and the metal base 21, heat radiation from the first support conductor 31A to the metal base 21, and heat radiation from the second support conductor 31B to the metal base 21. In other words, the first insulating layer 41 is provided for the purpose of ensuring electrical insulation and heat radiation. On the other hand, the second insulating layer 51 is provided mainly for the purpose of ensuring electrical insulation between the first support conductor 31A and the second support conductor 31B. Therefore, in the semiconductor device 100 of the present embodiment, the first insulating layer 41 and the second insulating layer 51 may be made of different materials as long as the purposes mentioned above are achieved.

The first insulating layer 41 has high electrical insulation and thermal conductivity, and is obtained mainly by dispersing a filler in a resin composition. The resin composition may be, for example, a thermosetting resin such as epoxy resin, phenol resin, or silicone rubber. Alternatively, the resin composition may be a thermoplastic resin such as polyethylene, polyimide, or acrylic resin. The filler is preferably alumina ($Al_2O_3$), boron nitride (BN), aluminum nitride (AlN), diamond (C), silicon carbide (SiC), silicon nitride ($Si_3N_4$), boron oxide ($B_2O_3$), or the like having high thermal conductivity. When the required thermal conductivity is low, the filler may be silicon dioxide ($SiO_2$) or a resin material such as silicone resin or acrylic resin. The filler may be one type only or a mixture of two types or more.

The second insulating layer 51 has high electrical insulation, and is obtained mainly by dispersing a filler in a resin composition. The resin composition may be, for example, a thermosetting resin such as epoxy resin, phenol resin, or silicone rubber. Alternatively, the resin composition may be a thermoplastic resin such as polyethylene, polyimide, or acrylic resin. The filler may be made of an inorganic ceramic material such as alumina ($Al_2O_3$), boron nitride (BN), aluminum nitride (AlN), diamond (C), silicon carbide (SiC), silicon nitride ($Si_3N_4$), silicon dioxide ($SiO_2$), or boron oxide ($B_2O_3$), or may be made of a resin material such as silicone resin or acrylic resin. The filler may be one type only or a mixture of two types or more.

The metal base substrate 11 is formed by molding the metal base 21, the first insulating layer 41, the support conductor 31 and the second insulating layer 51 into an integral unit. In the semiconductor device 100, the thickness of the support conductor 31 is the same as the thickness of the second insulating layer 51, which makes the molding by press working or mold forming easier. The molding method is not particularly limited, and may be a molding process to be described below, for example.

A first example of the molding process will be described. The metal base 21 and the first insulating layer 41 are molded into an integral unit by press working. For example, a thick copper plate may be used as a flat plate material for the support conductor 31, and the thick copper plate is patterned by etching or punching to form the support conductor 31. The etching may be performed on one surface or both surfaces. The support conductor 31 and the material of the second insulating layer 51 are molded into an integral unit. The metal base 21 and the first insulating layer 41 which are molded into an integral unit as described above and the support conductor 31 and the second insulating layer 51 which are molded into an integral unit as described above are molded into an integral unit by press working to form the metal base substrate 11.

A second example of the molding process will be described. Similar to the first example, the metal base 21 and the first insulating layer 41 are molded into an integral unit, and a thick copper plate is patterned to form the support conductor 31. The metal base 21 and the first insulating layer 41 which are molded into an integral unit, the support conductor 31, and the material of the second insulating layer 51 are molded into an integral unit by using a mold to form the metal base substrate 11.

A third example of the molding process will be described. Similar to the first example, the metal base 21 and the first insulating layer 41 are molded into an integral unit. The metal base 21 and the first insulating layer 41 which are molded into an integral unit and a thick copper plate which is used as a flat plate material for the support conductor 31 are molded into an integral unit by press working. After the thick copper plate, the metal base 21 and the first insulating layer 41 are molded into an integral unit, the thick copper plate is patterned by etching to form the support conductor 31. The material of the second insulating layer 51 is poured into the pattern of the support conductors 31 and cured to form the metal base substrate 11.

The semiconductor element 71 may be a power semiconductor element such as an insulated gate bipolar transistor (IGBT), a metal oxide semiconductor field-effect transistor (MOSFET) or a freewheel diode (FWD), or may be a control semiconductor element such as an IC chip or a diode configured to drive and/or control the power semiconductor element. In the present embodiment, the semiconductor element 71 is made of a semiconductor material such as silicon (Si), and it may be made of a wide bandgap semiconductor material such as silicon carbide (SiC), gallium nitride (GaN) or diamond (C). A plurality of semiconductor elements 71 may be provided, and the plurality of semiconductor elements 71 may be the same as each other or different from each other in the type, or the material, or both.

The case 61 is made of a material having low permeability to moisture. The case 61 is preferably made of a thermoplastic resin such as polyphenylene sulfide (PPS), polybutylene terephthalate (PBT), or polyether ether ketone (PEEK). Further, if the case 61 is sufficiently thick, the case 61 may be made of a thermosetting resin having relatively high moisture permeability. Alternatively, the case 61 may be made of a fluorine-based resin such as polytetrafluoroethylene (PTFE), a ceramic material or a glass material, or a mixture thereof. The case 61 is disposed on the metal base substrate 11. The case 61 and the metal base substrate 11 are not particularly limited, and may be bonded to each other by an adhesive, for example.

The external terminal 74 is not particularly limited, and may be made of a metal material such as copper (Cu) or aluminum (Al). The wiring member such as the wire 84 is configured to electrically connect the external terminal 74 and the semiconductor element 71, and may be made of a metal material such as copper (Cu) or aluminum (Al). The wiring member such as a wire may not be used, and instead, a lead frame structure may be adopted. In this case, a part of the support conductor is extended to the outside of the insulating layer and is bent as the external terminal. Since the external terminal is exposed to the outside air, when moisture infiltrates through the boundary surface between the external terminal and the case, it is concerned that the moisture may easily pass through the interface between the support conductor and the sealing resin provided at the bent end of the external terminal to reach the semiconductor element mounted on the support conductor. On the other hand, in the semiconductor device 100 of the present embodiment, the external terminal 74 and the wiring member such as the wire 84 are provided as separate members and electrically connected. The surface area of the wire 84 is generally smaller than the surface area of the portion of the lead frame structure which is extended from the support conductor and corresponds to the wire. In other words, as compared with the lead frame structure, the surface area of a moisture absorption path between the wire 84 and the sealing resin 77 is smaller. Therefore, even if the moisture may infiltrate through the boundary surface between the external terminal and the case, the amount of moisture that may infiltrate through the boundary surface between the wire 84 and the sealing member is smaller.

The sealing member 77 is made of an electrically insulating resin such as epoxy resin, silicone resin, urethane resin, polyimide resin, polyamide resin, or acrylic resin. The sealing member 77 may be made of an insulating composite material dispersed with a filler for improving the mechanical strength and the thermal conductivity of the sealing member 77. The filler for improving the mechanical strength and the thermal conductivity of the sealing member 77 may be made of an inorganic ceramic material such as silicon dioxide ($SiO_2$), alumina ($Al_2O_3$), aluminum nitride (AlN), boron nitride (BN), silicon nitride ($Si_3N_4$), diamond (C), silicon carbide (SiC), or boron oxide ($B_2O_3$).

Next, effects of the semiconductor device 100 of the present embodiment configured as described above will be described. In the semiconductor device 100 illustrated in FIG. 1, the support conductor 31 is thicker than the first insulating layer 41. Further, in order to diffuse heat in the area direction, the surface area of the support conductor 31 is larger than the surface area of the semiconductor element 71. Although the first insulating layer 41 is made of a composite material obtained by dispersing a filler in an epoxy resin or the like so as to increase the thermal conductivity, such a composite material has lower thermal conductivity than a metal material or an alloy constituting the support conductor 31, in other words, has poor heat radiation. Therefore, by making the support conductor 31 having good heat radiation thicker than the first insulating layer 41 having relatively poor heat radiation, the heat generated in the semiconductor element 71 may diffuse in the thick support conductor 31 in the area direction, and may be radiated to the metal base 21 through the intermediary of the first insulating layer 41 with a larger area, thereby improving the heat radiation of the semiconductor device. In order to ensure the electrical insulation between the first support conductor 31A and the second support conductor 31B, the second insulating layer 51 provided on the side surface of the support conductor 31 should be made thicker as the first support conductor 31A and the second support conductor 31B become thicker. Therefore, according to the semiconductor device 100 of the present embodiment, since the case 61 is provided outside the second insulating layer 51, even if the case 61 is provided on the metal base substrate 11, it is possible to prevent the moisture from infiltrating from the side surface of the second insulating layer 51, which makes it possible to prevent the deterioration of the semiconductor element. Therefore, the reliability of the semiconductor device is improved. As describe in the above, in the semiconductor device 100, in order to ensure the heat radiation, the support conductor 31 is configured to have a surface area larger than the surface area of the semiconductor element 71, and the support conductor 31 may be configured to have a surface area equal to the surface area of the semiconductor element 71. In this case, it is possible to reduce the size of the semiconductor device.

In the semiconductor device 100, the surface area of the metal base 21 is larger than the sum of the surface area of the support conductor 31 and the surface area of the second insulating layer 51. Thus, in the semiconductor device 100, the metal base substrate 11 has a stepwise structure in the outer peripheral region. According to the semiconductor device 100 having such a configuration, when the semiconductor element 71 generates heat during operation, the heat is radiated in the vertical direction via the solder 81, the support conductor 31, the first insulating layer 41 and the metal base 21, and the heat radiation in the area direction is also promoted. Therefore, the heat radiation of the semiconductor device 100 is further improved due to the stepwise structure of the metal base substrate 11, which makes it possible to improve the reliability of the semiconductor device.

In the semiconductor device 100, the support conductor 31 is thicker than the metal base 21. In the semiconductor device 100 of the present embodiment, instead of injecting a sealing member such as a composite material obtained by dispersing a filler in a resin material between the first support conductor 31A and the second support conductor 31B, the second insulating layer 51 and the first support conductor 31A and the second support conductor 31B are molded into an integral unit to form the metal base substrate 11. In order to reduce the size of the semiconductor device, it is desired that the gap between the first support conductor 31A and the second support conductor 31B is made as small as possible as long as the electrical insulation is guaranteed. If the first support conductor 31A and the second support conductor 31B are made thicker than that in a conventional semiconductor device, it is difficult to inject the sealing member into the gap between the first support conductor 31A and the second support conductor 31B without voids. On the other hand, in the semiconductor device 100 of the present embodiment, by increasing the thickness of the support conductor 31, it is possible to improve the heat radiation in the area direction; and by molding the metal base substrate 11 into an integral unit, it is possible to form the second insulating layer 51 without voids even if the gap between the first support conductor 31A and the second support conductor 31B is made as small as possible, which makes it possible to guarantee the electrical insulation and reduce the size of the semiconductor device. Therefore, it is possible to improve the heat radiation and reliability of the semiconductor device and reduce the size thereof.

Further, the metal base substrate 11 in the semiconductor device 100 includes the metal base 21, the first insulating layer 41, the support conductor 31 and the second insulating layer 51, and the rigidity thereof is ensured mainly by the support conductor 31 and the metal base 21. In a conventional semiconductor device, the support conductor is made relatively thin and the metal base is made relatively thick so as to ensure the rigidity of the metal base substrate as a whole. In such a conventional semiconductor device, if the metal base is made thinner so that a heat sink or the like may be attached thereto for the purpose of improving the heat radiation of the metal base substrate, since both the support conductor and the metal base are made thinner, the rigidity of the metal base substrate as a whole may become weaker. Therefore, in the present embodiment, the support conductor 31 is made relatively thick and the metal base 21 is made relatively thin, in other words, the support conductor 31 is made thicker than the metal base 21, it is possible to ensure the rigidity of the metal base substrate 11 as a whole and improve the heat radiation thereof. Further, since the metal base 21 is made thinner, compared with the case where both the support conductor 31 and the metal base 21 are made thicker, it is possible to reduce the material cost.

In the present embodiment, the thicknesses of the metal base 21, the thicknesses of the first insulating layer 41, and the thicknesses of the support conductor 31 are not particularly limited, but it is preferable that the thicknesses of the metal base 21 is 500 to 1000 μm, the thicknesses of the first insulating layer 41 is 150 to 175 μm, and the thicknesses of the support conductor 31 is 1000 to 2000 μm so as to form the metal base substrate 11 with improved heat radiation and rigidity. Therefore, in order to ensure the heat radiation and the rigidity of the metal base substrate 11, the thicknesses of the metal base 21, the thicknesses of the first insulating layer 41 and the thicknesses of the support conductor 31 are configured in such a manner that the support conductor 31 has the greatest thickness, the metal base 21 has the second greater thickness, and the first insulating layer 41 has the smallest thickness.

Figure 3:
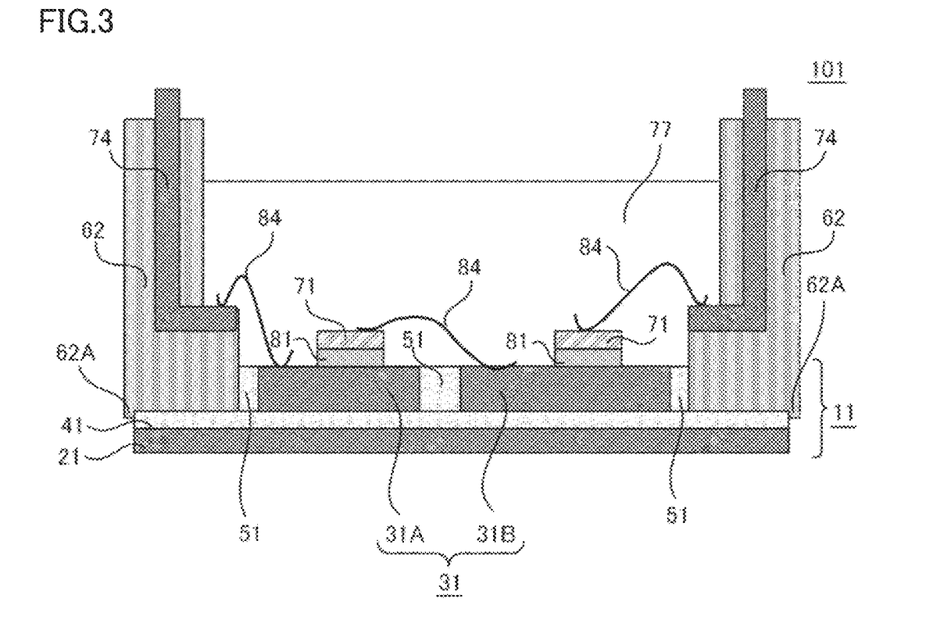
FIG. 3 is a cross-sectional view illustrating the configuration of a first modification of the semiconductor device according to the first embodiment of the present invention.

FIG. 3 is a cross-sectional view illustrating the configuration of a semiconductor device 101 as a first modification of the semiconductor device of the present embodiment. As illustrated in FIG. 3, a projection portion 62A is provided on the outer periphery of a lower portion of the case 62 such that a part of the case 62 covers at least a part of the outer peripheral region of the first insulating layer 41. According to the semiconductor device 101 having such a configuration, it is possible to prevent the positional displacement of the case 62 with respect to the metal base substrate 11. Therefore, it is possible to further prevent the infiltration of moisture through the gap between the boundary surfaces due to the positional displacement of the case 62, which makes it possible to improve the reliability of the semiconductor device. The semiconductor device 101 illustrated in FIG. 3 and described as a first modification of the semiconductor device 100 of the present embodiment is characterized in the shape of the case, and the case 62 having the projection portion 62A described with reference to FIG. 3 may be applied to the other configuration described in the present embodiment, or may be applied to the other embodiments as long as there is no contradiction.

Figure 4:
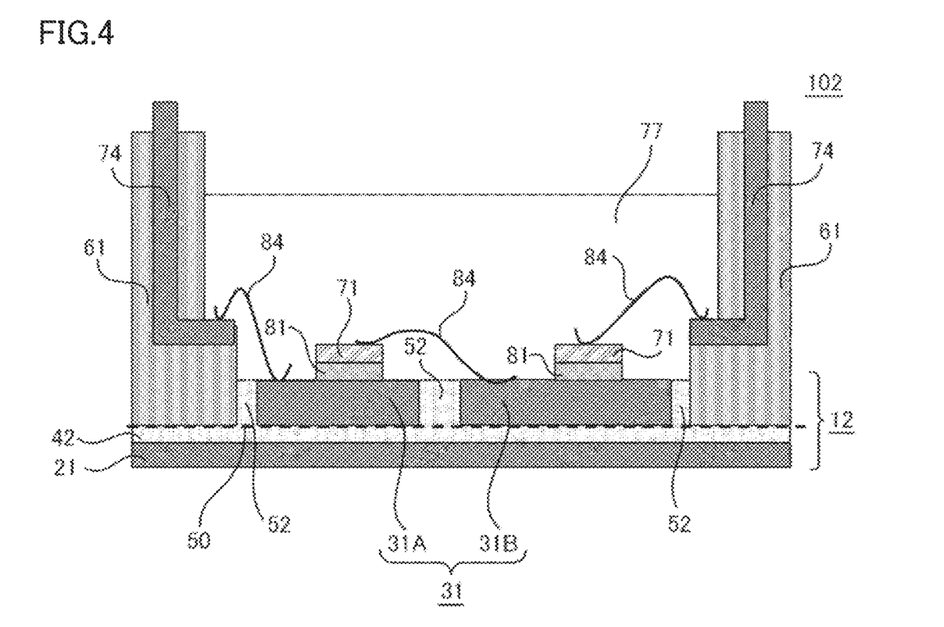
FIG. 4 is a cross-sectional view illustrating the configuration of a second modification of the semiconductor device according to the first embodiment of the present invention.

FIG. 4 is a cross-sectional view illustrating the configuration of a semiconductor device 102 as a second modification of the semiconductor device of the present embodiment. As illustrated in FIG. 4, the first insulating layer 42 and the second insulating layer 52 are made of the same material, and are formed into an integral unit without a boundary surface 50 formed therebetween. According to the semiconductor device 102 having such a configuration, in the molding step of the metal base substrate 12, a composite material for forming the first insulating layer 42 and the second insulating layer 52 is stacked on the metal base 21, the patterned support conductor 31 is embedded in the composite material, and thereafter the composite material is cued. According to the semiconductor device 102 having such a configuration, since the boundary surface 50 is not present between the first insulating layer 42 and the second insulating layer 52, it is possible to prevent the infiltration of moisture through the boundary surface, which makes it possible to improve the reliability of the semiconductor device. The semiconductor device 102 illustrated in FIG. 4 and described as a second modification of the semiconductor device 100 of the present embodiment is characterized in that the first insulating layer 42 and the second insulating layer 52 are molded into an integral unit without a boundary surface 50 formed therebetween, and the integral configuration of the first insulating layer 42 and the second insulating layer 52 may be applied to the other configuration described in the present embodiment, or may be applied to the other embodiments as long as there is no contradiction.

Figure 5:
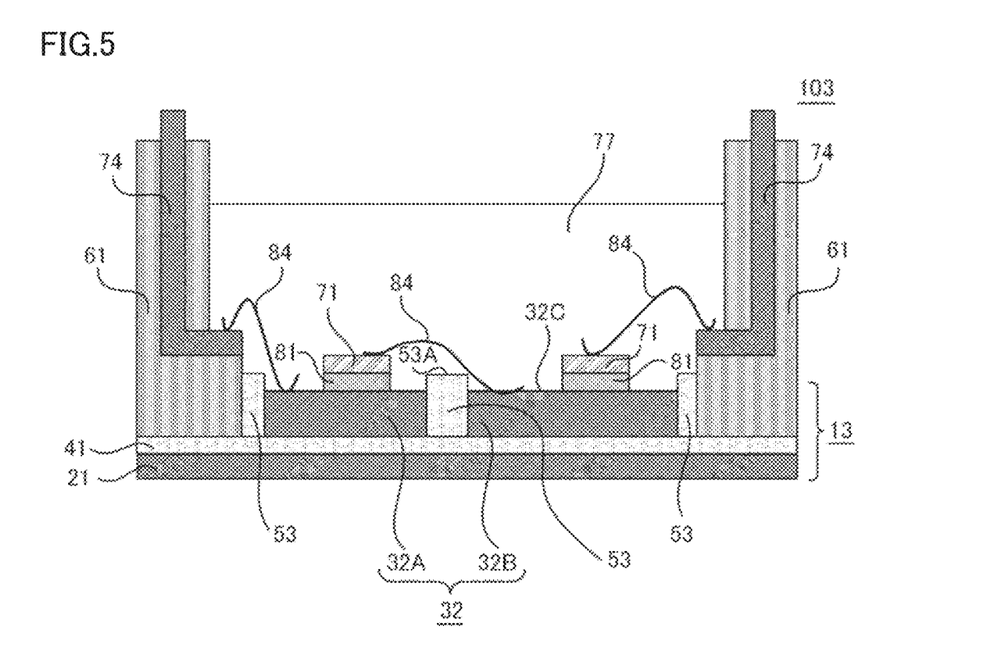
FIG. 5 is a cross-sectional view illustrating the configuration of a third modification of the semiconductor device according to the first embodiment of the present invention.

FIG. 5 is a cross-sectional view illustrating the configuration of a semiconductor device 103 as a third modification of the semiconductor device of the present embodiment. As illustrated in FIG. 5, the second insulating layer 53 is thicker than the support conductor 32. In other words, an upper surface 53A of the second insulating layer 53 is formed higher than an upper surface 32C of the support conductor 32. The second insulating layer 53 is provided for ensuring the electrical insulation between the first support conductor 32A and the second support conductor 32B. According to the semiconductor device 103 having such a configuration, by increasing the creepage distance between the first support conductor 32A and the second support conductor 32B, it is possible to further improve the electrical insulation, which makes it possible to further improve the reliability of the semiconductor device. The semiconductor device 103 illustrated in FIG. 5 and described as a third modification of the semiconductor device 100 of the present embodiment is characterized in that the second insulating layer 53 is thicker than the support conductor 32, the configuration that the second insulating layer 53 is thicker than the support conductor 32 may be applied to the other configuration described in the present embodiment, or may be applied to the other embodiments as long as there is no contradiction.

Second Embodiment

Figure 6:
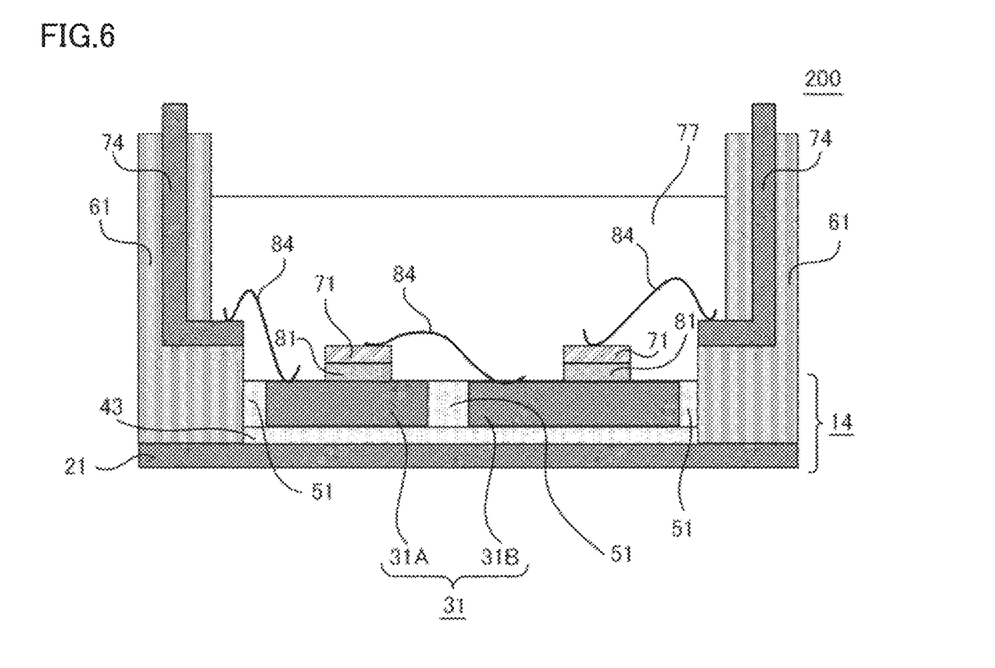
FIG. 6 is a cross-sectional view illustrating the configuration of a semiconductor device according to a second embodiment of the present invention.

A semiconductor device according to a second embodiment of the present invention will be described, with reference to FIG. 6. FIG. 6 is a cross-sectional view illustrating the configuration of a semiconductor device 200 of the present embodiment. The semiconductor device 200 of the present embodiment includes a metal base substrate 14 having a metal base 21, a first insulating layer 43, a support conductor 31 and a second insulating layer 51, a semiconductor element 71, a case 61, an external terminal 74, and a scaling member 77. The semiconductor device 200 of the present embodiment is similar to the semiconductor device 100 of the first embodiment in that the case 61 is provided outside the second insulating layer 51, but is different from the semiconductor device 100 of the first embodiment in that the case 61 is also provided outside the first insulating layer 43.

The surface area of the first insulating layer 43 is equal to the sum of the surface area of the support conductor 31 and the surface area of the second insulating layer 51. In the semiconductor device 200, the metal base 21 is not particularly limited, and may be bonded to the case 61 by an adhesive or the like.

The metal base substrate 14 is formed by molding the metal base 21, the first insulating layer 43, the support conductor 31, and the second insulating layer 51 into an integral unit. The molding method is not particularly limited, and may be the same as the molding process described in the first embodiment or a molding process to be described below.

An example molding process will be described. For example, a thick copper plate is used as a flat plate material for the support conductor 31, and the thick copper plate is patterned by etching or punching to form the support conductor 31. The etching may be performed on one surface or both surfaces. The support conductor 31 is molded with the material of the second insulating layer 51 into an integral unit. The support conductor 31 and the second insulating layer 51 which are molded into an integral unit, the metal base 21, and the material of the first insulating layer 43 are molded into an integral unit by press working or mold molding to form the metal base substrate 14.

As described in the second embodiment, according to the semiconductor device 200 having such a configuration, it is possible to prevent the infiltration of moisture from the side surface of the second insulating layer 51, which makes it possible to prevent the deterioration of the semiconductor element, and therefore, it is possible to improve the reliability of the semiconductor device. Further, by providing the case outside the first insulating layer 43, it is also possible to prevent the infiltration of moisture from the side surface of the second insulating layer 51, which makes it possible to prevent the deterioration of the semiconductor element, and therefore, it is possible to further improve the reliability of the semiconductor device.

Figure 7:
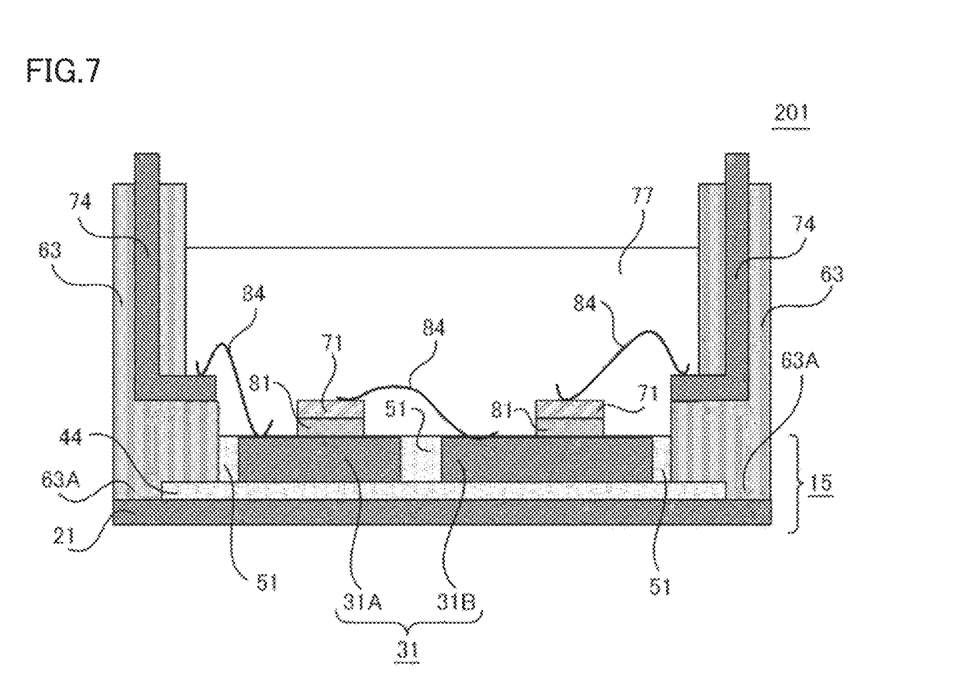
FIG. 7 is a cross-sectional view illustrating the configuration of a modification of the semiconductor device according to the second embodiment of the present invention.

FIG. 7 is a cross-sectional view illustrating the configuration of a semiconductor device 201 as a modification of the semiconductor device of the present embodiment. As illustrated in FIG. 7, the surface area of the first insulating layer 44 is larger than the sum of the surface area of the support conductor 31 and the surface area of the second insulating layer 51. In the semiconductor device 201, the metal base 21 and the first insulating layer 44 are not particularly limited, and at least one of them may be bonded to the case 63 by an adhesive or the like.

According to the semiconductor device 201 having such a configuration, since the case is provided outside both the first insulating layer 44 and the second insulating layer 51, it is possible to prevent the infiltration of moisture from the side surface of the first insulating layer 44 and the side surface of the second insulating layer 51, which makes it possible to prevent the deterioration of the semiconductor element, and therefore, it is possible to improve the reliability of the semiconductor device.

Regarding the surface area of the metal base 21, the surface area of the first insulating layer 44, the surface area of the support conductor 31 and the surface area of the second insulating layer 51 in the semiconductor device 201, the surface area of the metal base 21 is the largest, the surface area of the first insulating layer 44 is smaller than the surface area of the metal base 21, and the sum of the surface area of the support conductor 31 and the surface area of the second insulating layer 51 is smaller than the surface area of the metal base 21 and the surface area of the first insulating layer 44. Therefore, as illustrated in FIG. 7, the metal base substrate 15 has a widened stepwise structure toward the edge. According to the semiconductor device 201 having such a configuration, when the semiconductor element 71 generates heat during operation, the heat is radiated in the vertical direction via the solder 81, the support conductor 31, the first insulating layer 44 and the metal base 21, and the heat radiation in the area direction is also promoted. Therefore, the heat radiation of the semiconductor device 201 is further improved due to the widened stepwise structure of the metal base substrate 15, which makes it possible to further improve the reliability of the semiconductor device.

Further, according to the configuration illustrated in FIG. 7, since the case 63 is provided with a projection portion 63A such that a part of the case 63 covers at least a part of the outer peripheral region of the first insulating layer 44, it is possible to prevent the positional displacement of the case 63 with respect to the metal base substrate 11 in the semiconductor device 201. Therefore, it is possible to further prevent the infiltration of moisture through the gap between the boundary surfaces, which makes it possible to improve the reliability of the semiconductor device. The semiconductor device 201 illustrated in FIG. 7 and described as a modification of the semiconductor device 200 of the present embodiment is characterized in the widened stepwise structure of the metal base substrate 15, and the widened stepwise structure of the metal base substrate 15 may be applied to the other embodiments as long as there is no contradiction.

Third Embodiment

Figure 8:
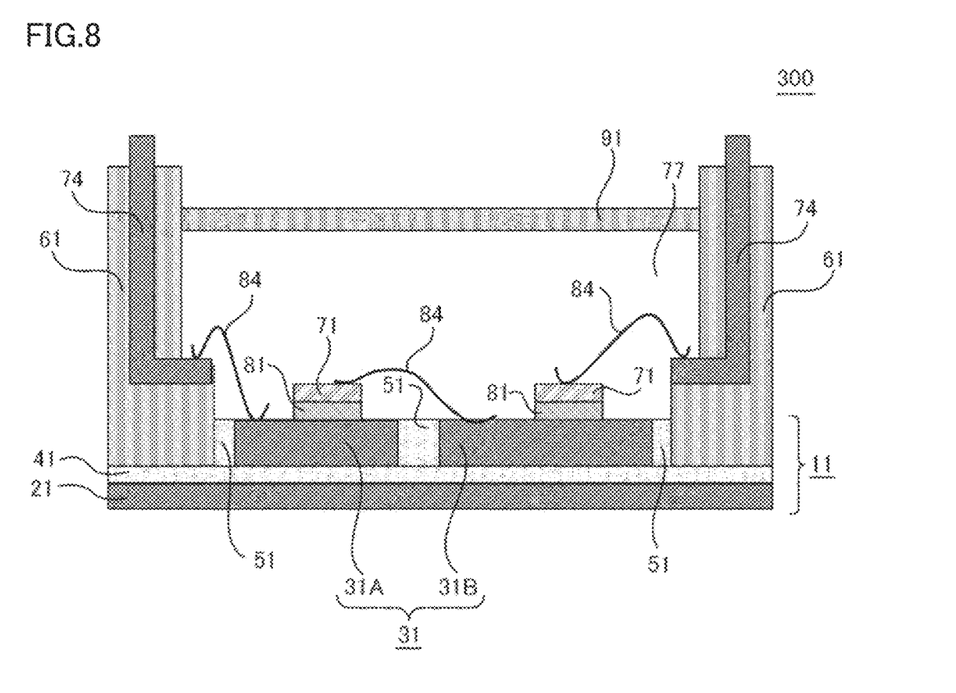
FIG. 8 is a cross-sectional view illustrating the configuration of a semiconductor device according to a third embodiment of the present invention.

A semiconductor device according to a third embodiment of the present invention will be described with reference to FIG. 8. FIG. 8 is a cross-sectional view illustrating the configuration of a semiconductor device 300 of the present embodiment. The semiconductor device 300 of the present embodiment includes a metal base substrate 11 having a metal base 21, a first insulating layer 41, a support conductor 31 and a second insulating layer 51, a semiconductor element 71, a case 61, an external terminal 74, and a sealing member 77. The semiconductor device 300 of the present embodiment is similar to the semiconductor device 100 of the first embodiment in that the case 61 is provided outside the first insulating layer 41, but is different from the semiconductor device 100 of the first embodiment in that a barrier layer 91 is provided on the sealing member 77 in a region inside the case 61 and is disposed at one side of the semiconductor element 71 opposite to the other side thereof where the metal base substrate 11 is disposed. The semiconductor device 300 illustrated in FIG. 8 is obtained by providing the barrier layer 91 in the semiconductor device 100 according to the first embodiment, but the barrier layer 91 may be provided in a modification of the semiconductor device 100 according to the first embodiment, or the semiconductor device 200 according to the second embodiment or a modification thereof. Although FIG. 8 illustrates a configuration in which the barrier layer 91 is provided in a region inside the case 61, but it is not limited thereto, and at least a part of the barrier layer 91 may be provided in a region outside the case 61.

The barrier layer 91 is made of a material having low permeability to moisture. For example, the barrier layer 91 is preferably made of a thermoplastic resin such as polyphenylene sulfide (PPS), polybutylene terephthalate (PBT), or polyether ether ketone (PEEK). Further, if the barrier layer 91 is sufficiently thick, the barrier layer 91 may be made of a thermosetting resin having relatively high permeability to moisture, a fluorine-based resin such as polytetrafluoroethylene (PTFE), a ceramic material or a glass material, or a mixture thereof. The barrier layer 91 and the case 61 are not particularly limited, and may be bonded to each other by, for example, an adhesive. The barrier layer 91 may be bonded to the sealing member 77.

As described in the third embodiment, according to the semiconductor device 300 having such a configuration, it is possible to prevent the infiltration of moisture from the side surface of the second insulating layer 51, which makes it possible to prevent the deterioration of the semiconductor element, and therefore, it is possible to improve the reliability of the semiconductor device. Further, by providing the barrier layer 91 on the sealing member 77 in a region inside the case 61, it is possible to prevent the infiltration of moisture from the upper surface of the sealing member 77, which makes it possible to prevent the deterioration of the semiconductor element, and therefore, it is possible to further improve the reliability of the semiconductor device.

Fourth Embodiment

Figure 9:
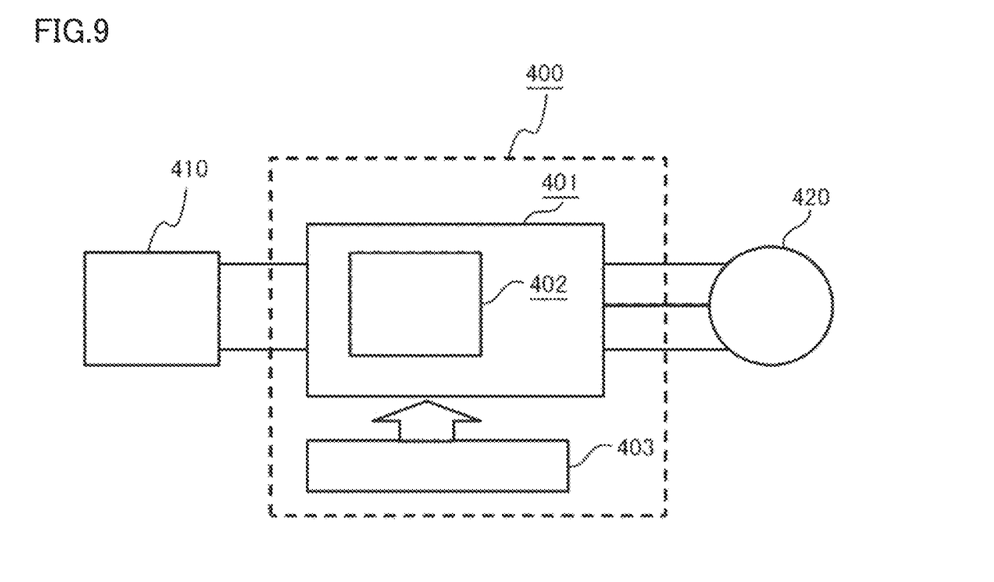
FIG. 9 is a block diagram illustrating the configuration of a power conversion system to which a power converter according to a fourth embodiment of the present invention is applied.

A power converter according to a fourth embodiment of the present invention, which is mounted with the semiconductor device according to any one of the first to third embodiments, will be described with reference to FIG. 9. FIG. 9 is a block diagram illustrating a power converter of the present embodiment. FIG. 9 illustrates a power conversion system to which the power converter of the present embodiment is applied. Hereinafter, the fourth embodiment will be described in detail by assuming that the power converter is a three-phase inverter.

The power conversion system illustrated in FIG. 9 includes a power source 410, a power converter 400 according to the present embodiment, and a load 420. The power source 410 is a DC power source, and supplies DC power to the power convener 400. The power source 410 is not particularly limited, and it may be, for example, a DC system, a solar cell or a storage battery, or may be a rectifier circuit or an AC/DC converter connected to an AC system. The power source 100 may be a DC/DC converter that converts DC power output from a DC system into a predefined power.

The power converter 400 is a three-phase inverter connected between the power source 410 and the load 420, and is configured to convert DC power supplied from the power source 410 into AC power and supply the AC power to the load 420. As illustrated in FIG. 9, the power converter 400 includes a main conversion circuit 401 that converts DC power into AC power and outputs the AC power, and a control circuit 403 that outputs a control signal for controlling the main conversion circuit 401 to the main conversion circuit 401.

The load 420 is a three-phase electric motor driven by the AC power supplied from the power converter 400. The load 420 is not particularly limited, it may be an electric motor mounted on various electric apparatuses such as an electric motor for a hybrid vehicle, an electric vehicle, a railroad vehicle, an elevator, or an air conditioner.

Hereinafter, the power converter 400 will be described in detail. The main conversion circuit 401 includes switching elements (not shown) and freewheel diodes (not shown). When the switching element is switched, the main conversion circuit 401 converts DC power supplied from the power source 410 into AC power and supplies the AC power to the load 420. The main conversion circuit 401 may have various circuit configurations. The main conversion circuit 401 according to the present embodiment is a two-level three-phase full bridge circuit, and may include six switching elements and six freewheel diodes connected in antiparallel to the switching elements, respectively. The semiconductor device 402 according to any one of the first to third embodiments described above may be applied to at least one of the switching elements and the freewheel diodes of the main conversion circuit 401. Among the six switching elements, every two switching elements are connected in series to form upper and lower arms, and each of the upper and lower arms forms each phase (U phase, V phase and W phase) of the full bridge circuit. The output terminals of the upper and lower arms, in other words, the three output terminals of the main conversion circuit 401 are connected to the load 420.

The main conversion circuit 401 includes a driving circuit (not shown) for driving each switching element. The driving circuit may be embedded in the semiconductor device 402 or may be provided separately from the semiconductor device 402. The driving circuit generates a driving signal for driving the switching elements of the main conversion circuit 401, and supplies the driving signal to control electrodes of the switching elements of the main conversion circuit 401. Specifically, the driving circuit, in accordance with a control signal from the control circuit 403 to be described later, outputs a driving signal for turning on the switching element and a driving signal for turning off the switching element to the control electrode of each switching element. In the case of maintaining the switching element in the ON state, the driving signal is a voltage signal (ON signal) equal to or higher than a threshold voltage of the switching element, and In the case of maintaining the switching element in the OFF state, the driving signal is a voltage signal (OFF signal) lower than the threshold voltage of the switching element.

The control circuit 403 controls the switching elements of the main conversion circuit 401 so as to supply a desired power to the load 420. Specifically, based on the power to be supplied to the load 420, the control circuit 403 calculates a time (ON time) to turn on each switching element of the main conversion circuit 401. For example, the control circuit 403 may control the main conversion circuit 401 by PWM control that modulates the ON time of each switching element based on the voltage to be output. Then, the control circuit 403 outputs a control command (control signal) to the drive circuit in the main conversion circuit 401 so as to output an ON signal to a switching element that should be turned on and an OFF signal to a switching element that should be turned off at each time. The driving circuit, in accordance with the control signal, outputs an ON signal or an OFF signal as a driving signal to the control electrode of each switching element.

In the power converter according to the present embodiment, the semiconductor device according to any one of the first to third embodiments is applied to at least one of the switching elements and the freewheel diodes of the main conversion circuit 401. Therefore, the reliability of the power converter according to the present embodiment is improved.

In the present embodiment, as an example, it is described that the semiconductor device is applied to a two-level three-phase inverter, but the semiconductor device is not limited thereto, it may be applied to various power converters. In the present embodiment, as an example, it is described that the power converter is a two-level power converter, but it may be a three-level power converter or a multi-level power converter. When the power converter supplies power to a single-phase load, the semiconductor device of the present embodiment may be applied to a single-phase inverter. When the power converter supplies power to a DC load or the like, the semiconductor device of the present embodiment may be applied to a DC/DC converter or an AC/DC converter.

The power converter according to the present embodiment is not limited to a power supply unit in which the load is an electric motor, it may be used as, for example, a power supply unit for an electric discharge machine or a laser machine, or a power supply unit for an induction cooker or a non-contact power supply system. The power converter according to the present embodiment may be used as a power conditioner for a photovoltaic power generation system, a power storage system, or the like.

REFERENCE SIGNS LIST 11, 12, 13, 14, 15: metal base substrate
21: metal base
31, 32: support conductor
31A, 32A: first support conductor
31B, 32B: second support conductor
32C: upper surface
41, 42, 43, 44: first insulating layer
50: boundary surface
51, 52, 53: second insulating layer
53A: upper surface
61, 62, 63: case
62A, 63A: projection portion
71: semiconductor element
74: external terminal
77: sealing member
81: solder
84: wire
91: barrier layer
100, 101, 102, 103, 200, 201, 300, 402: semiconductor device
400: power converter
401: main conversion circuit
403: control circuit
410: power source
420: load

The invention claimed is:

1. A semiconductor device comprising:
a metal base substrate which includes a metal base, a first insulating layer provided on a surface of the metal base, a support conductor provided on a surface of the first insulating layer opposite to the surface on which the metal base is provided, and a second insulating layer provided in contact with the surface of the first insulating layer opposite to the surface on which the metal base is provided and a side surface of the support conductor to expose a surface of the support conductor opposite to the surface in contact with the first insulating layer;
a semiconductor element bonded to the support conductor;
a case provided outside the second insulating layer and in contact with the first insulating layer;
an external terminal attached to the case;
a sealing member filled in a region surrounded by the support conductor, the second insulating layer and the case; and
a wire provided in the sealing member and configured to connect to the external terminal to the semiconductor element,
wherein the side surface of the support conductor nearest to the case and a side surface of the case are connected by the second insulating layer, and
in a cross-sectional view, an upper surface of the second insulating layer is in contact with the sealing member, and the wire is provided directly above the upper surface of the second insulating layer.

2. The semiconductor device according to claim 1, wherein the support conductor is thicker than the first insulating layer, and the second insulating layer is thicker than the first insulating layer.

3. The semiconductor device according to claim 1, wherein a surface area of the support conductor is larger than a surface area of the semiconductor element.

4. The semiconductor device according to claim 1, wherein a surface area of the metal base is larger than a sum of a surface area of the support conductor and a surface area of the second insulating layer.

5. The semiconductor device according to claim 1, wherein the support conductor is thicker than the metal base.

6. The semiconductor device according to claim 1, wherein the case is provided outside the first insulating layer.

7. The semiconductor device according to claim 1, wherein the first insulating layer and the second insulating layer are made of different materials.

8. The semiconductor device according to claim 1, wherein the first insulating layer and the second insulating layer are made of the same material and integrally formed.

9. The semiconductor device according to claim 1, wherein the second insulating layer is as thick as the support conductor.

10. The semiconductor device according to claim 1, wherein the second insulating layer is thicker than the support conductor.

11. The semiconductor device according to claim 1, further comprising a barrier layer, wherein the barrier layer is provided on the sealing member and is disposed at one side of the semiconductor element opposite to an other side thereof where the metal base substrate is disposed.

12. A power converter comprising:
a main conversion circuit that includes the semiconductor device according to a main conversion circuit that includes the semiconductor device according to the main conversion circuit being configured to convert an input power and output the converted power; and
a control circuit configured to output a control signal for controlling the main conversion circuit to the main conversion circuit.

13. The semiconductor device according to claim 1, wherein the metal base substrate and the support conductor are made of different materials.

14. The semiconductor device according to claim 1, wherein the metal base substrate and the support conductor are made of a same material.

15. The semiconductor device according to claim 14, wherein the same material includes copper, aluminum, an aluminum-silicon carbide alloy, or a copper-molybdenum alloy.

16. The semiconductor device according to claim 1, wherein the metal base substrate includes a heat radiation fin.

17. The semiconductor device according to claim 1, wherein the semiconductor element includes an insulated gate bipolar transistor (IGBT), a metal oxide semiconductor field-effect transistor (MOSFET), or a freewheel diode (FWD).

18. The semiconductor device according to claim 17, wherein the semiconductor element is made of silicon, silicon carbide, gallium nitride, or diamond.

19. The semiconductor device according to claim 1, wherein the case is made of a thermoplastic resin.

20. The semiconductor device according to claim 1, wherein the sealing member includes an electrically insulating resin.

* * * * *